United States Patent
Kenington (12)

(10) Patent No.: US 6,794,931 B2
(45) Date of Patent: Sep. 21, 2004

(54) SWITCHED AMPLIFIER

(75) Inventor: Peter Kenington, Chepstow (GB)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/204,996

(22) PCT Filed: Feb. 19, 2001

(86) PCT No.: PCT/GB01/00691

§ 371 (c)(1),
(2), (4) Date: Oct. 21, 2002

(87) PCT Pub. No.: WO01/63745

PCT Pub. Date: Aug. 30, 2001

(65) Prior Publication Data

US 2003/0112063 A1 Jun. 19, 2003

(30) Foreign Application Priority Data

Feb. 25, 2000 (GB) .............................................. 0004569

(51) Int. Cl.[7] .................................................. H03F 3/38
(52) U.S. Cl. ......................................... 330/10; 330/136
(58) Field of Search ......................... 330/10, 107, 129, 330/136, 149

(56) References Cited

U.S. PATENT DOCUMENTS

| 5,194,823 A | 3/1993 | Wendt et al. ................ 330/137 |
| 5,420,536 A | 5/1995 | Faulkner et al. ............. 330/149 |
| 5,430,416 A | 7/1995 | Black .......................... 332/149 |
| 5,450,044 A | 9/1995 | Hulick ........................ 332/103 |
| 5,861,777 A * | 1/1999 | Sigmon et al. ............. 330/136 |
| 5,880,633 A | 3/1999 | Leizerovich et al. .......... 330/84 |
| 6,445,247 B1 * | 9/2002 | Walker ........................ 330/10 |

FOREIGN PATENT DOCUMENTS

| EP | 0 360 178 A2 | 3/1990 |
| EP | 0 385 641 A | 9/1990 |
| FR | 2 766 637 A | 1/1999 |

* cited by examiner

Primary Examiner—Steven J. Mottola
(74) Attorney, Agent, or Firm—Steve Mendelsohn

(57) ABSTRACT

An imput signal is provided in polar format comprising an amplitude component (210) and a phase component (212). The amplitude component (210) is supplied to a pulse width modulator (219) which derives pulse width modulated (PWM) signal. The PWM signal is used to control a switch (224) which modulates the phase component (212). The modulated phase component (212) is amplified at (216). The output of amplifier (216) has a desired envelope, as dictated by the PWM signal, whose characteristics are, in turn, derived from the amplitude component (210). Either or both of the amplitude component (210) and the phase component (212) can be predistorted (226, 218).

19 Claims, 9 Drawing Sheets

SWITCHED AMPLIFIER

BACKGROUND OF THE INVENTION

1. Field of the Invention

The invention relates to amplifiers and methods for amplifying signals, and in particular to amplification of a signal provided in terms of polar components.

2. Description of the Related Art

The use of envelope restoration in a linear transmitter (or envelope elimination and restoration—EER—in the case of an amplifier), as an efficiency boosting mechanism, has been proposed. The essence of the technique is to utilise high efficiency RF amplifiers (e.g. class-C, D or E) and to apply the required envelope variations by modulating the amplifier supply. Assuming that this varying high power supply can be supplied with appropriate high efficiency, then the technique is capable of very high levels of overall DC-RF power conversion efficiency. The mechanism for supplying this high power envelope is therefore critical to the process.

FIG. 1 shows the configuration of a conventional EER amplifier. The input signal to be amplified contains both phase and amplitude modulation is of the form $V_{in}(t)=V(t)\cos[\omega_c t+\phi(t)]$. The input signal is split into a baseband signal $S_1(t)=V(t)$, representing the envelope of the input signal, and a RF signal, $S_2(t)=\cos[\omega_c t+\phi(t)]$, which represents the phase (or frequency) modulation of the original input signal, and is a constant-envelope, phase-modulated signal. The RF signal $S_2$ may be created simply by limiting the RF input $V_{in}$ to remove the amplitude modulation, thus leaving only the phase (or frequency) modulation. The baseband signal $S_1$ corresponding to the amplitude variations of the input signal may be created either by diode detection of the input signal, or by coherent detection using the carrier signal after the above mentioned limiter. The latter method will produce more accurate (lower distortion) results, but will lead to increased complexity for the system overall. For this reason, diode based envelope detection has been employed in many EER transmitters to date.

The constant-envelope, phase-modulated signal $S_2$ is then amplified by a high efficiency RF amplifier 100, e.g. of class-C, D or E. This will preserve the phase modulation information and transmit it to the output of the system. The baseband amplitude modulation signal $S_1$ is amplified by a suitably efficient audio amplifier 110, or is used to feed a pulse-width modulator with subsequent class-D power amplification. Finally, the resulting high power audio signal is used to modulate the collector or power supply of RF amplifier 100. This high-level modulation process restores the signal envelope to the output of amplifier 100 and, assuming that the relevant delays between the two paths conveying signals $S_1$ and $S_2$ are suitably equalised, results in a high power replica $V_{out}=GS_1(t)S_2(t)$ of the input signal being produced at the output.

There are several main sources of intermodulation distortion in the type of amplifier shown in FIG. 1. These are the bandwidth of the envelope modulator (e.g. a class-S amplifier), the differential delay between the signals $S_1$ and $S_2$, AM-PM conversion in amplifier 100 (when being high-level amplitude modulated), "encoding" error in the high-level modulator (i.e. errors between the actual and ideal response of the modulator at a given input amplitude level), and cut-off occurring in the amplifier 100 at low envelope levels.

SUMMARY OF THE INVENTION

The invention aims to reduce some or all of these forms of distortion and thereby provide more linear amplification.

According to one aspect, the invention provides apparatus for amplifying an input signal to produce an output signal, comprising means for providing the input signal in polar format comprising amplitude and phase components, amplifying means and modulating means, wherein the modulating means modulates the phase component with a pulse width modulated (PWM) signal derived from the amplitude component and the amplifying means receives the modulated phase component for amplification to produce the output signal.

According to another aspect, the invention provides a method of amplifying an input signal to produce an output signal, comprising providing the input signal in polar form comprising an amplitude component and a phase component, modulating the phase component with a pulse width modulated (PWM) signal derived from the amplitude component and amplifying the modulated phase component to produce the output signal.

Unlike the conventional EER technique of FIG. 1, the PWM signal of the invention does not need to be a high power signal. In FIG. 1, the PWM signal needs to be a high power signal because it is used to supply power to the amplifier 100 for amplifying the phase-modulated signal. As mentioned previously, the PWM signal of FIG. 1 is amplified to a high power signal (i.e. at the full power required of the amplifier) and it must therefore be amplified by an appropriate high power switching amplifier. The bandwidth capability of this (usually class-D) amplifier is fundamentally restricted by the device capacitance of the high-power device employed. With current technology, the bandwidth limitation is generally of the order of 10 MHz, limiting the usable bandwidth of the overall system to the order of 100 kHz to 1 MHz.

Where a PWM signal is used to restore the bandwidth of an amplified signal, the intermodulation distortion (IMD) level of the overall amplification system is directly related to the "over sampling" rate of the PWM process relative to the bandwidth of the envelope signal (i.e. the amplitude component of the input signal). The oversampling rate should generally be at least 10 times, but can advantageously be increased to 50 or 100 times in order to achieve high linearity (over 60 dBc in theory). It is much easier to achieve a high sampling rate using the invention with a low power PWM signal and a switching process.

In traditional EER systems, such as that shown in FIG. 1, it is essential to time-align the signals conveying the envelope and phase information at the amplifier 100, where the envelope is restored to the signal. For a 30 MHz bandwidth signal (e.g. a multi-carrier base station signal), with a desired IMD performance of -70 dBc, this time alignment must be better than about 330 ps. This can be difficult to achieve when it is considered that the envelope processing (PWM) processing, amplification, filtering etc. may have a delay measured in $\mu$s. Using the lower power envelope processing system used in the invention, this delay is considerably reduced, making the time alignment operation much easier.

In the amplification system of FIG. 1, significant AM-PM distortion can be introduced by amplifier 100, when being high-level amplitude modulated. The present invention exhibits less AM-PM distortion since the PWM signal is not supplied at high level. Furthermore, the amplification system of FIG. 1 may exhibit cut-off when the power supply to amplifier 100 is modulated to a low level. This problem is avoided by the present invention since the amplifier power supply is no longer being modulated.

Advantageously, the modulating means comprises switching means for selectively supplying the phase component to the amplifier, the switching action of the switching means being controlled by the PWM signal, thereby modulating the phase component with the PWM signal.

A linearisation scheme may be employed to counteract distortion in the system. In a preferred embodiment, the input signal can be predistorted to counter distortion in the system. Either the amplitude or phase component of the input signal or both may be predistorted. Predistortion of the phase component of the input signal assists in the further reduction of AM-PM distortion, such as may be introduced by the switching action of the switch means.

Where a linearisation scheme is employed, it is possible to use a feedback signal from the amplifier output to provide adaptive control of the linearisation scheme.

The provision of the input signal in amplitude and phase components will depend upon the nature of the input signal received by the system. For example, the input signal may comprise two baseband channels conveying phase and amplitude modulation information respectively. The amplitude channel may be used directly as the amplitude component by a PWM process (possibly subsequent to predistortion) to generate the PWM signal. The baseband phase channel can be modulated onto a carrier signal using, for example, a voltage control oscillator (VCO) to generate the phase component which is selectively supplied to the amplifier.

Alternatively, the input signal may comprise a quadrature format signal or an amplitude and phase modulated signal, either of which may be used to produce the amplitude and phase components.

BRIEF DESCRIPTION OF THE DRAWINGS

By way of example only, certain embodiments of the invention will now be described with reference to the accompanying figures, in which.

DETAILED DESCRIPTION

Figure 1:
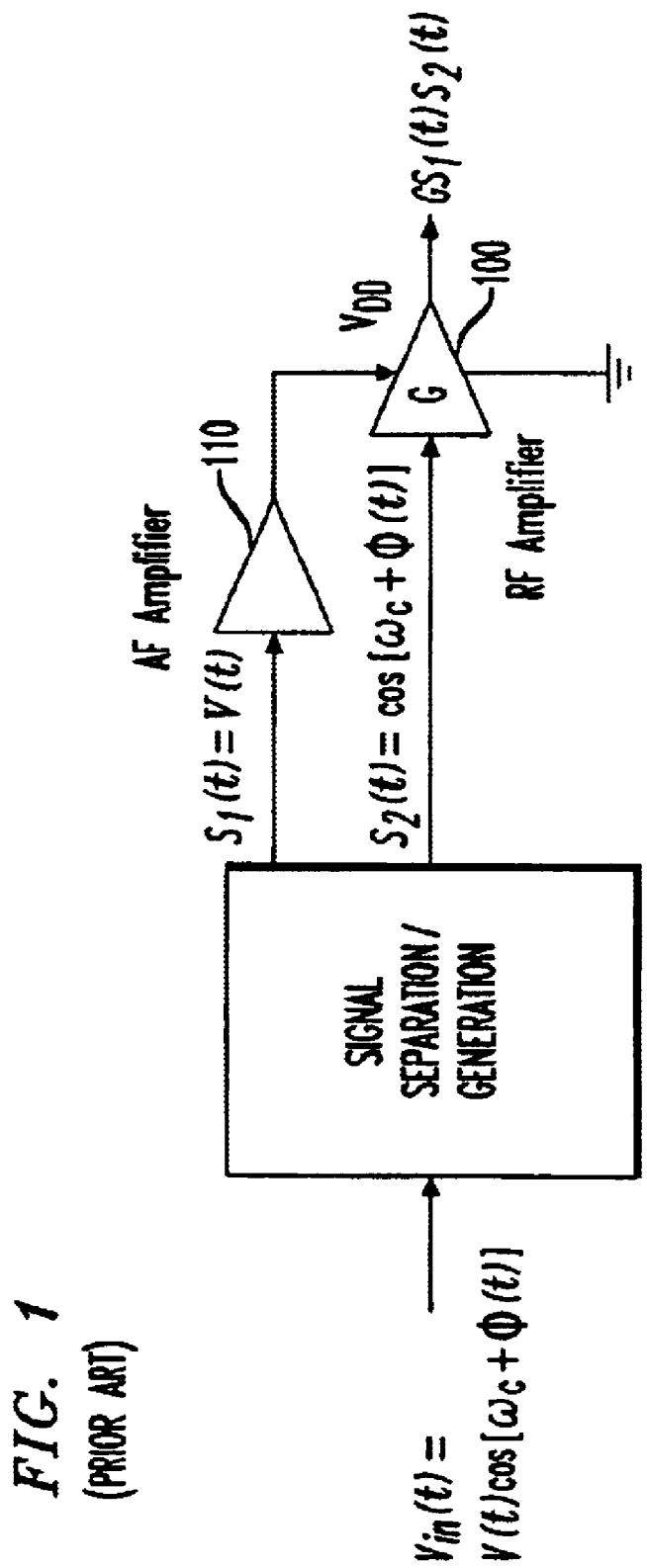
FIG. 1 is a block diagram of a known EER amplifier.

In the following description, elements common to more than one of the described amplifier configurations retain the same reference numerals and the description of their function will not be repeated.

Figure 2:
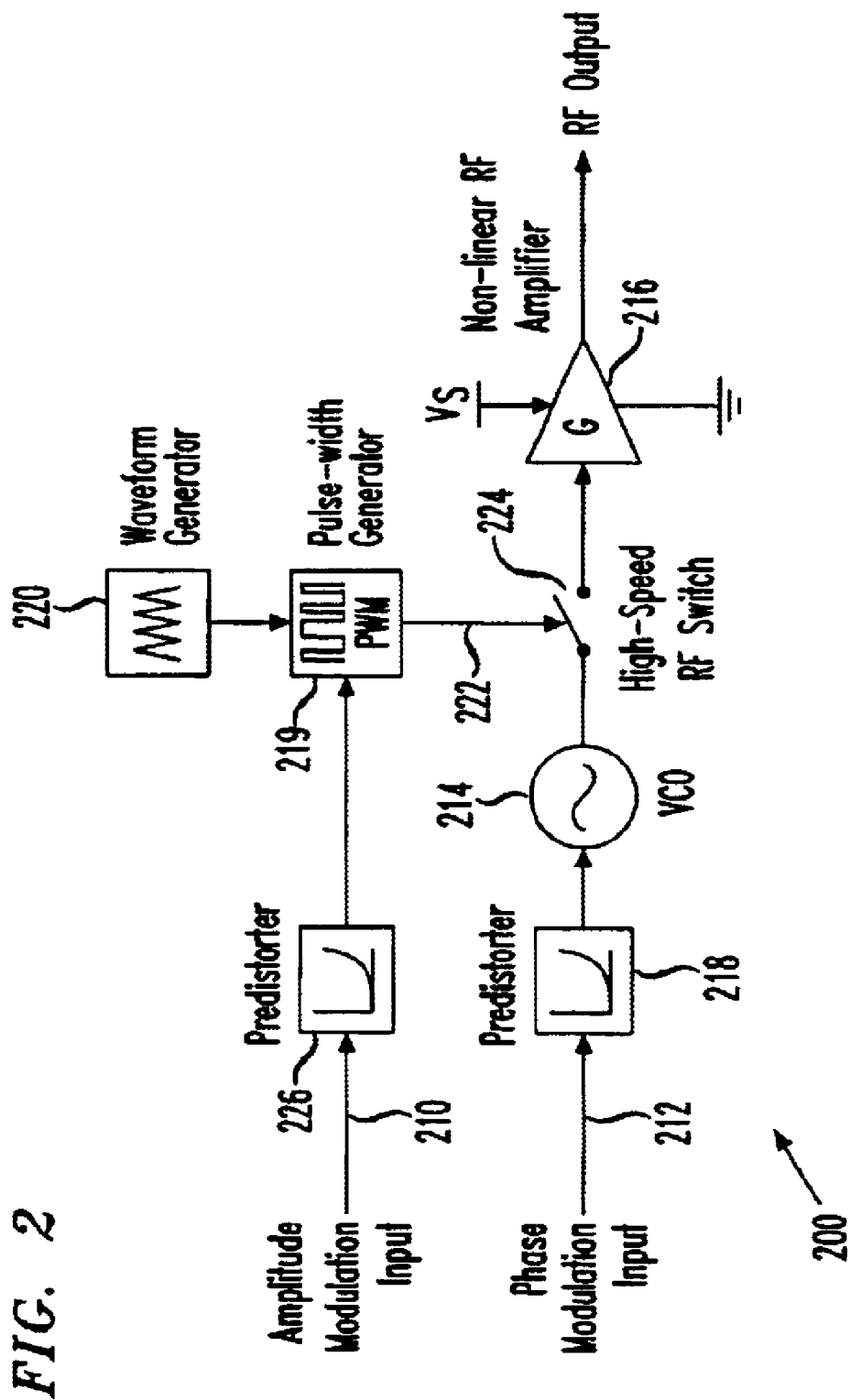
FIGS. 2 to 6 each illustrate schematically an amplifying scheme using envelope restoration.

The amplifier configuration 200 of FIG. 2 receives an input signal in the form of separate baseband channels 210 and 212 which convey amplitude modulation information and phase modulation information respectively. The baseband channels 210 and 212 are supplied by, for example, a digital signal processor (DSP).

The phase channel 212 directly modulates a VCO 214 or frequency synthesiser (which may incorporate up or down conversion to the final carrier or system frequency), for subsequent amplification by a non-linear RF amplifier 216. The phase channel is predistorted by predistorter 218 in order to counteract the effects of AM-PM distortion occurring in the system. The envelope dictated by the amplitude channel 210 is imposed upon the final output signal by means of a pulse width modulation (PWM) process 219 applied to the phase-modulated RF output of the VCO 214.

The PWM process 219 uses the standard technique of comparing the amplitude modulation information on the amplitude channel 210 with a high frequency triangular waveform produced by generator 220. The result of the comparison is a binary signal 222 whose waveform has a duty cycle dependent upon the amplitude information conveyed by the amplitude channel 210, i.e. the binary signal 222 comprises a train of pulses whose width depends upon the amplitude indicated on channel 210 relative to the triangular waveform. There are other methods of implementing the PWM process, notably involving the use of DSP, field programmable gate array (FPGA) or erasable programmable read only memory (EPROM)-based look-up table techniques, any of which could be applied in place of process 219.

The binary signal 222 is used to control a high speed RF switch 224. The state of switch 224 changes each time the binary signal 222 changes levels. The switch 224 imposes the PWM waveform of the binary signal 222 onto the phase modulated RF signal output by VCO 214. The switch 224 could be implemented as a PIN diode or a FET series switch and may thus be a power-efficient component. The rapid switching action of switch 224 and its effect on the non-linear amplifier 216 introduces AM-PM distortion to the system, but this is countered by predistorter 218.

The PWM process 219 may contain some degree of non-linearity and hence some form of linearisation may be required. However, process 219 will be more linear than, say the RF input/output transfer characteristic of a class-C amplifier, and hence the degree of linearisation required will be realistic. In FIG. 2, this linearisation is provided by predistorter 226, which operates on the amplitude channel 210. It will be appreciated that, depending on the desired linearity of the system, either or both of the predistorters 218 and 226 may be omitted.

The output signal from the non-linear RF amplifier 216 is filtered by an output band pass filter (not shown), and this filter acts to reconstruct the desired, modulated RF waveform, eliminating all unwanted out-of-band products. The amplifier configuration 200 offers substantial benefits over the conventional EER amplifier of FIG. 1. The PWM modulation in configuration 200 is performed at low power hence avoiding the bandwidth restrictions of the (typically) class-D amplifier used to create the high power PWM supply to amplifier 100 in FIG. 1. Further, it is easier to achieve a desirably high sampling rate for the PWM process 219 (which operates at low power) than that used in FIG. 1 (which operates at high power).

Figure 3:
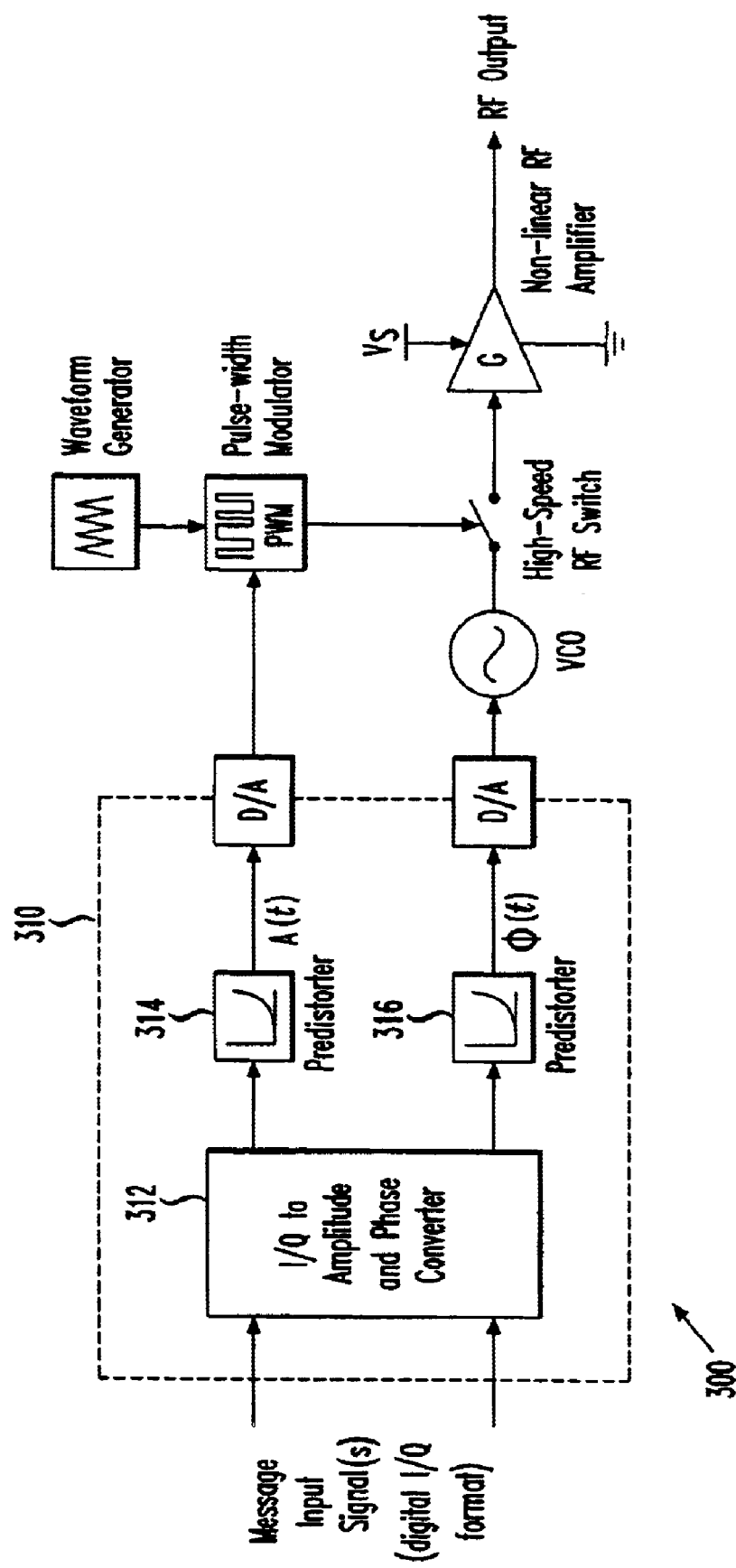

In the amplifier configuration 300 of FIG. 3 the input signal is provided in quadrature format, comprising I&Q components at baseband. The quadrature format input signal is supplied to DSP 310, which operates a quadrature-to-polar conversion process 312, which produces amplitude and phase baseband signals for corresponding predistorters 314 and 316. The predistorted amplitude and phase signals are then converted to analogue signals and processed as previously described with reference to FIG. 2.

The conversion process 312 can be performed by real-time calculation or by means of a predetermined look-up table. Advantageously, the predistortion processes 314 and 316 are also implemented using look-up tables. Non-real time feedback may be used to update the digital predistortion look-up tables, as will be described later.

In the introduction, it was mentioned that it is desirable to time-align the amplitude and phase modulation at the switch (224 in FIG. 2). Amplifier configuration 400 of FIG. 4 is based on configuration 300, and illustrates how the use of a DSP 310 facilitates the time-alignment of the phase and amplitude modulation.

Figure 4:
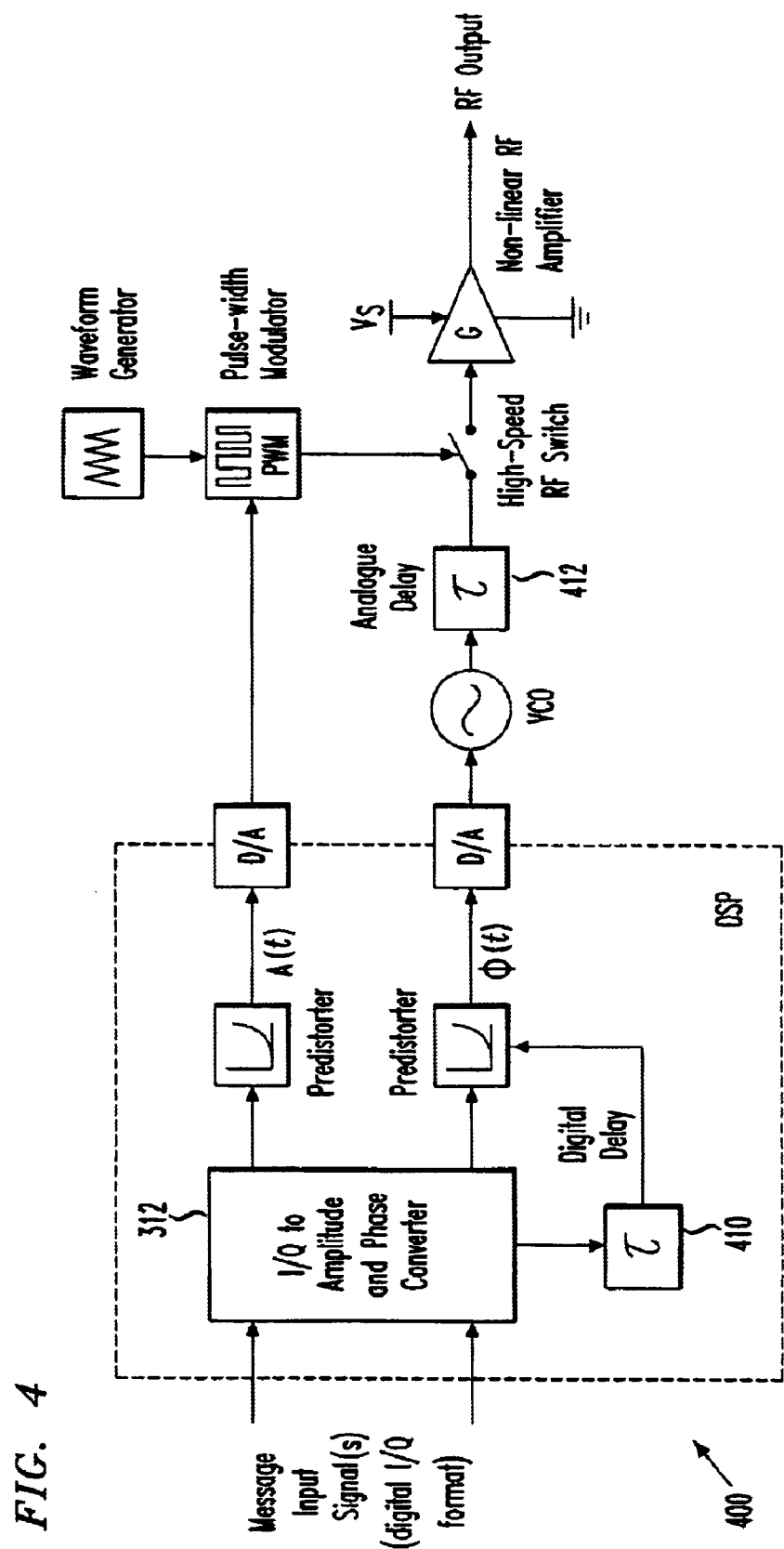

In FIG. 4 the phase component output by the conversion process 316 is subjected to a digital delay process 410. Delay 410 compensates for the bulk of the delay present in the envelope path (due to the PWM process). This delay can be implemented to an accuracy determined by the clock rate of the digital part of configuration 400. An analogue delay 412 can be added after the VCO producing the phase modulated signal to produce the required "fine tuning" of the artificial delay to precisely match the delay between the amplitude and phase paths at the high speed RF switch.

The purpose of this dual artificial delay approach is to greatly reduce the length (and hence physical size) of the analogue delay line 412. Without the digital delay 410 the analogue delay line 412 could extend to many hundreds of meters or more, due to the potentially large delays involved. In the absence of the digital delay 410, it would be impractical to implement a wholly analogue delay and it would also be impractical to adjust such an entirely analogue delay to an accuracy of a few hundred pico-seconds.

Figure 5:
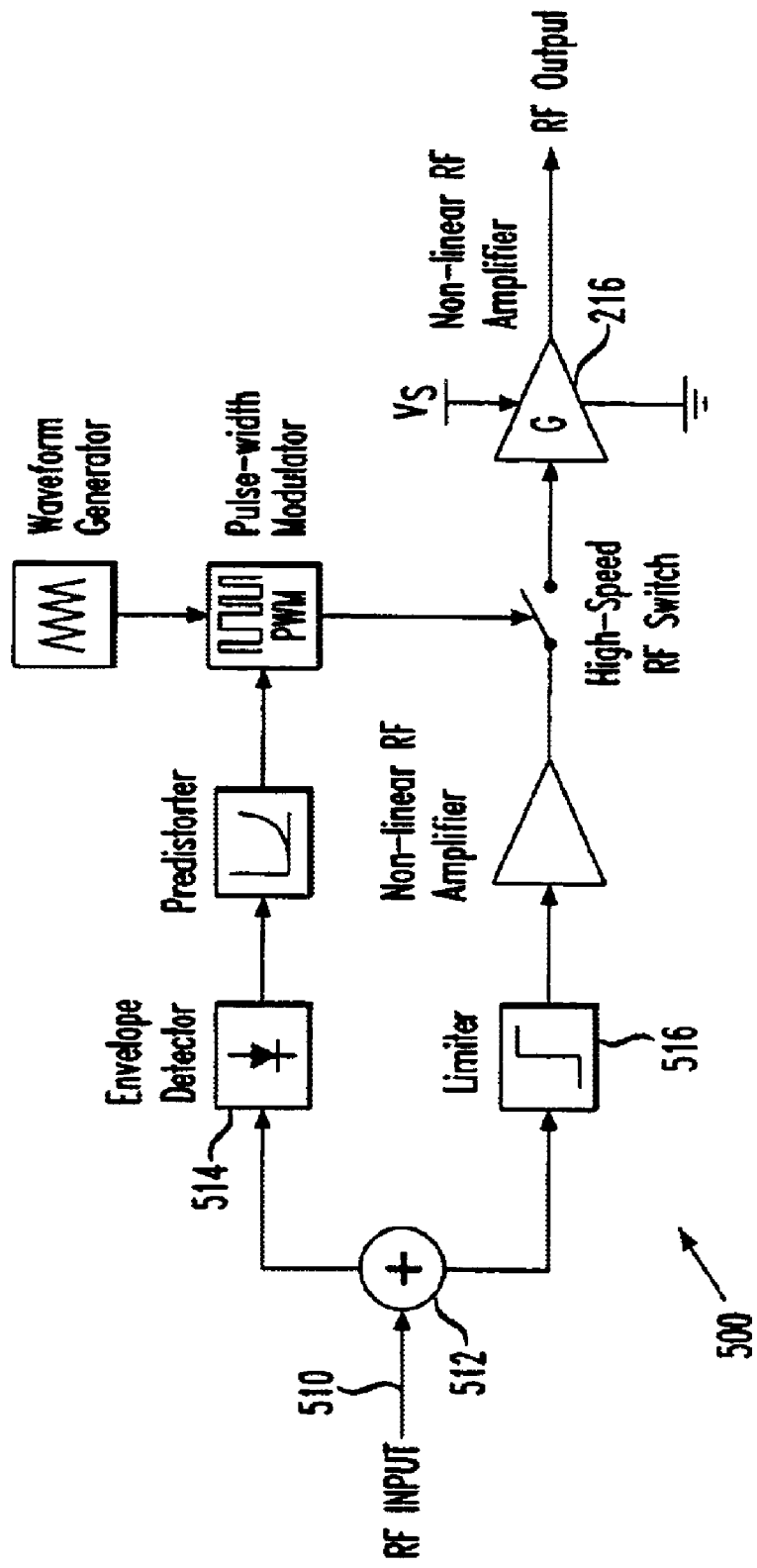

Amplifier configuration 500 of FIG. 5 operates on an RF input signal 510. The input signal 510 is supplied by a splitter 512 to each of an envelope detector 514 and a limiter 516. The envelope detector 514 produces a signal indicative of the envelope of the input signal and this signal is used to produce the binary signal for controlling the RF switch, in the same manner as the amplitude channel signal 210 in FIG. 2. The output of limiter 516 is a constant-envelope, phase-modulated signal, which is supplied to non-linear RF amplifier 216 via the RF switch under the control of the binary signal.

Figure 6:
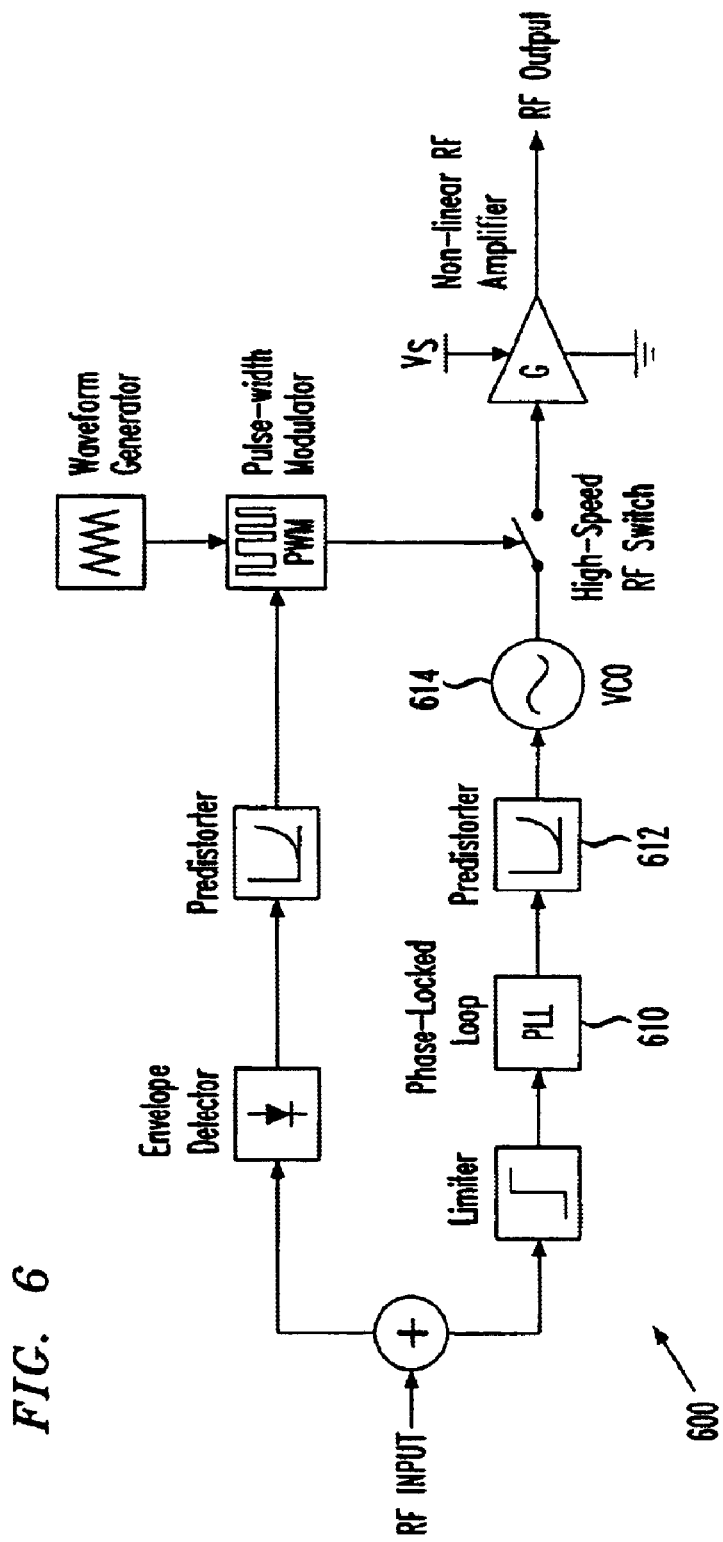

An enhanced version of configuration 500 is illustrated in FIG. 6 as amplifier configuration 600. Here, the constant-envelope, phase-modulated output of the limiter is supplied to phase locked loop (PLL) 610 which demodulates the phase information therefrom. The resulting phase modulation information is predistorted at 612 and supplied to VCO 614 which produces a predistorted constant-envelope, phase-modulated signal for modulation by the RF switch. Predistortion process 612 assists in the reduction of AM-PM distortion within the system. The use of VCO 614 permits frequency translation of the input signal, if desired (e.g. in a repeater application).

It is possible to implement adaptive control of the predistorters used in amplifier configurations 200 to 600. Some examples of adaptive predistortion techniques will now be described.

Figure 7:
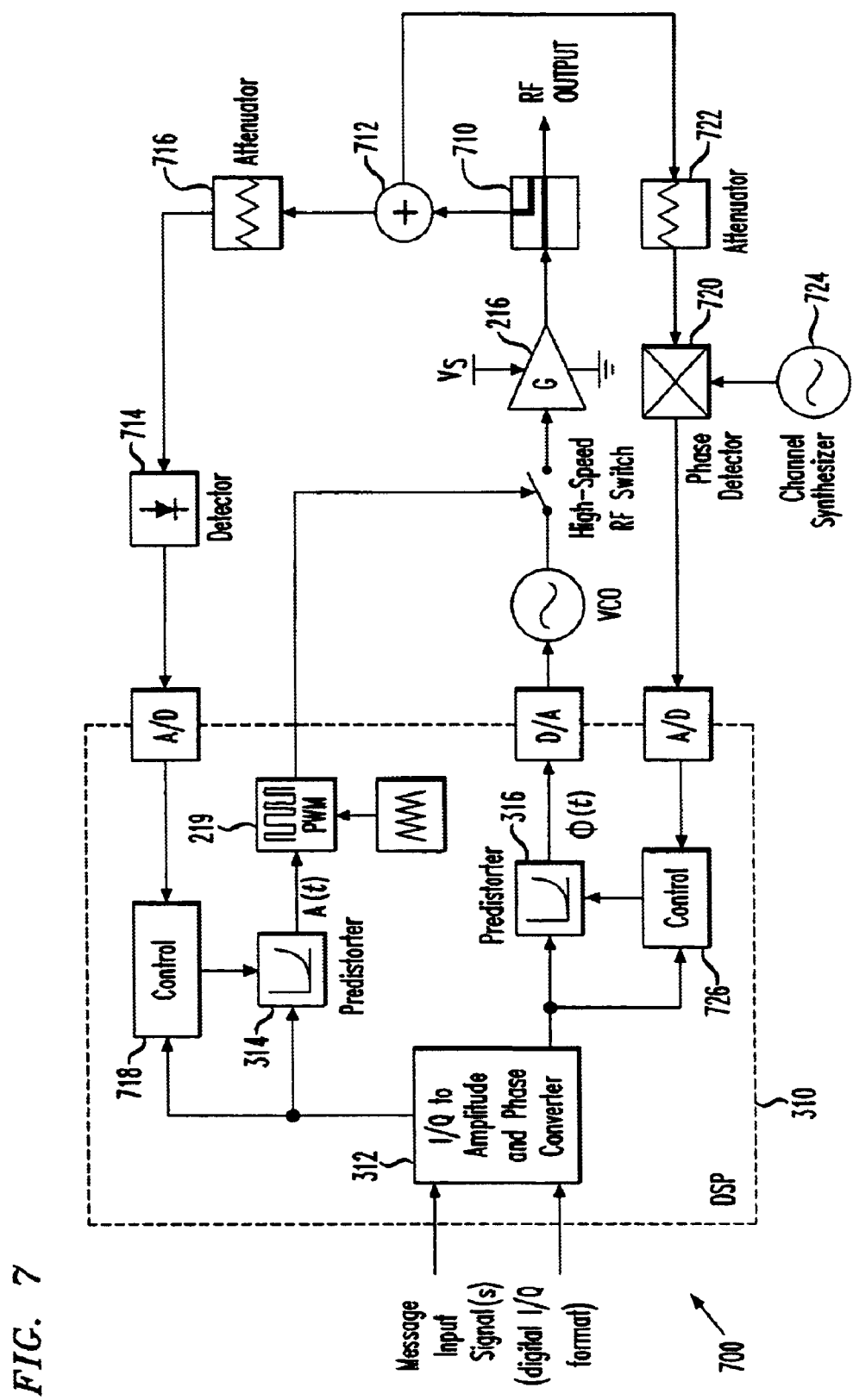
FIGS. 7 to 9 each illustrate an envelope-restoration amplification scheme using adaptive linearisation.

Amplifier configuration 700 of FIG. 7 illustrates the implementation of adaptive control for the predistorters 314 and 316 of amplifier configuration 300.

In configuration 700, the RF output of the system is sampled at directional coupler 710 and provided to splitter 712. The sampled output is provided to an envelope detector 714 via an attenuator 716. The detected envelope of the (attenuated) output signal sample is supplied (via appropriate ADC) to a control process 718 in the DSP 310. The control process 718 also receives the amplitude component output by conversion process 312. Control process 718 develops an error signal from the difference between its inputs. Control process 718 adjusts the predistortion characteristic of predistorter 314 to minimise the error signal.

The splitter 712 also provides the sampled output signal to phase detector 720 via an attenuator 722. The phase detector 720 uses a signal from channel synthesiser 724 at the wanted output channel frequency in conjunction with the attenuated output signal sample to produce a phase error signal. The phase error signal is fed to the controller where it is corrected to compensate for the pure time-delay of the amplifier 216. The control process 726 adapts the predistortion characteristic predistorter 316 to minimise the compensated error.

The control processes 718 and 726 may be implemented either wholly or partially in the analogue domain, using known techniques. Similarly, the predistorters 314 and 316 can be implemented using conventional methodology.

FIG. 7 also illustrates that the PWM process 219 can be performed in the digital domain within DSP 310.

Figure 8:
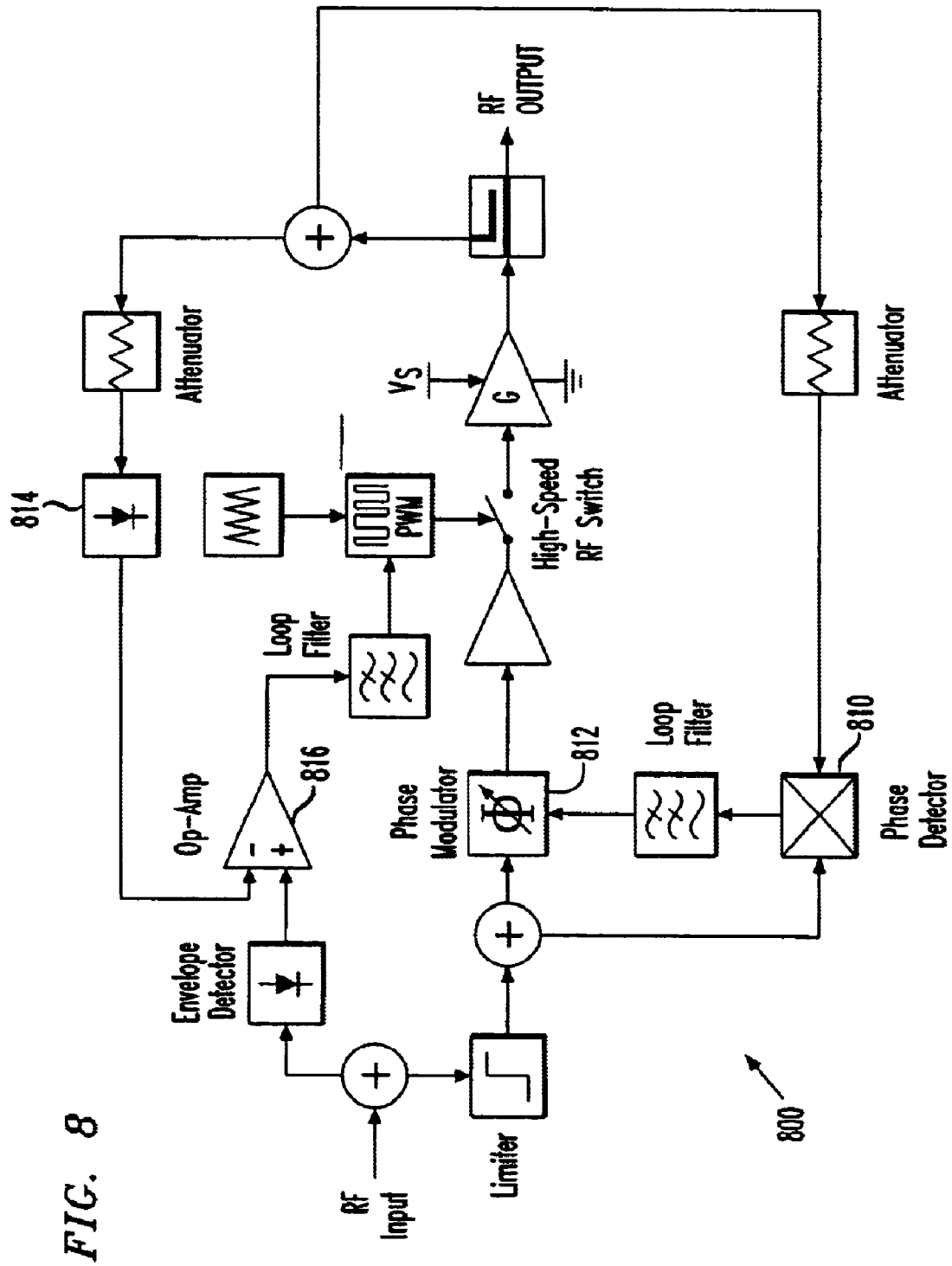

FIG. 8 illustrates an alternative amplifier configuration 800 which implements a linearisation mechanism which is suitable for narrowband signals. Here, the feedback process operates in a conventional polar loop format and the predistorters are unnecessary. In amplifier configuration 800, the input signal is supplied to each of an envelope detector and a limiter, as described in relation to FIG. 5. Phase detector 810 uses an (attenuated) output signal sample (which could also be amplitude-limited) and a sample of the constant-envelope, phase-modulated signal from the limiter to produce an error signal for controlling phase modulator 812. Phase modulator 812 corrects the phase of the constant-envelope, phase-modulated signal from the limiter to reduce the distortion appearing in the overall output of the system.

The sampled output signal is also supplied to an envelope detector 814 (via an attenuator). The detected envelope of the output signal is supplied to the inverting input of an op-amp 816. The detected envelope of the input signal is supplied to the non-inverting input of the op-amp 816. The output of the op-amp 816 is used as a corrected amplitude modulation information signal for generating the binary signal in the PWM process.

Figure 9:
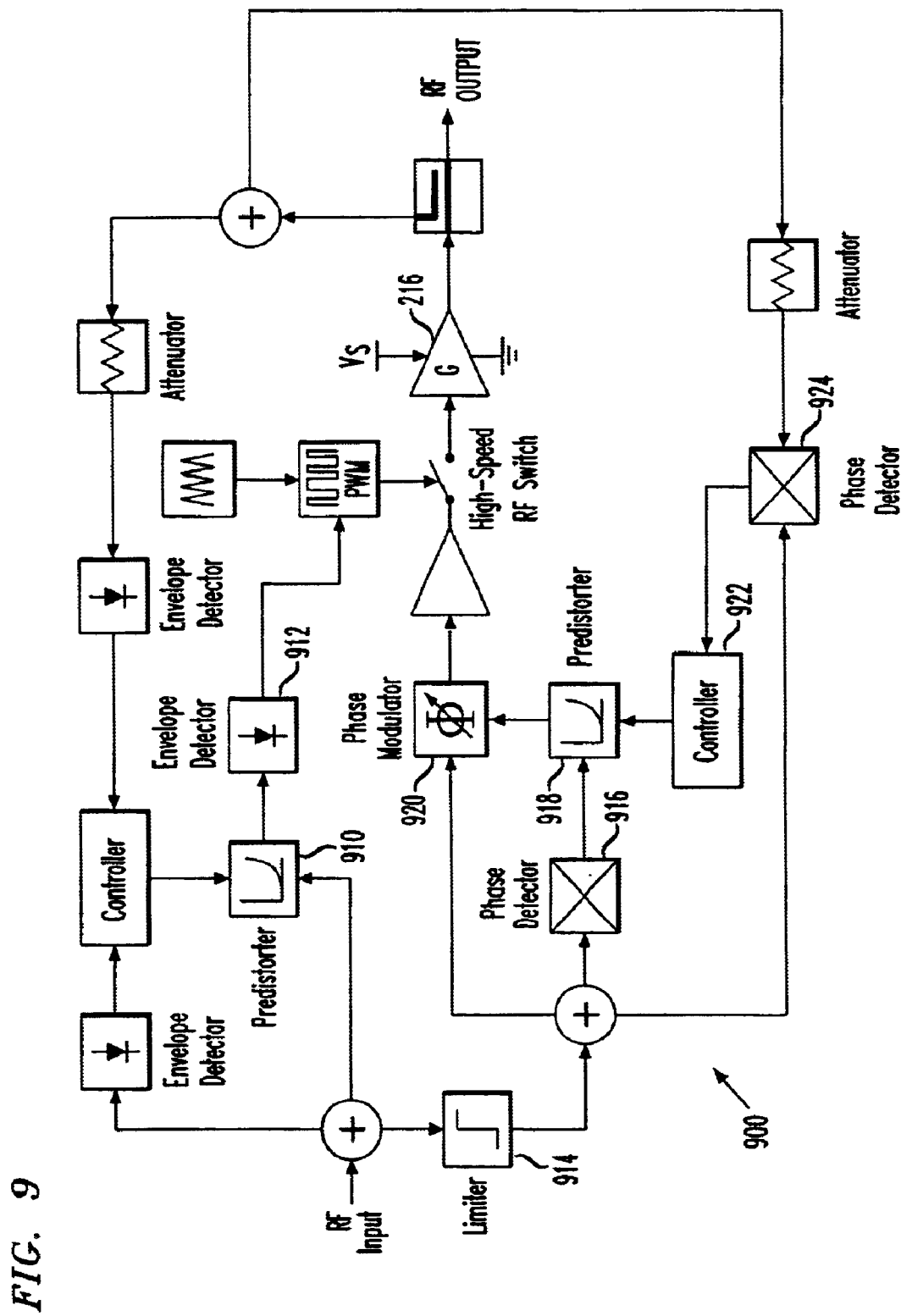

In the amplifier configuration 900 of FIG. 9, predistortion is applied at RF. Predistorter 910 operates on the RF input signal prior to envelope detector 912, the output of which is used by the PWM process to generate the binary signal for controlling the RF switch. The predistorter 910 is adapted by the controller on the basis of a comparison of the detected envelopes of the input and output signals to the system.

The RF input signal is supplied to a limiter 914 which outputs a corresponding constant-envelope, phase-modulated signal. The phase modulation of this signal is detected by phase detector 916. The phase modulation information output by phase detector 916 is predistorted by predistorter 918 and used to drive phase modulator 920 operating on the constant-envelope, phase-modulated signal output by limiter 914. The predistorter 918 operating on the phase modulation information output by phase detector 916 is adapted to cause phase modulator 920 to minimise phase distortion in the output of amplifier 216.

The adaption of predistorter 918 is performed by controller 922 on the basis of a signal from phase detector 924. Phase detector 924 supplies controller 922 with an error signal derived by comparing the phase of the sampled output signal of amplifier 216 and the phase of the constant-envelope, phase-modulated signal from limiter 914.

What is claimed is:

1. An apparatus for amplifying an input signal provided in polar format comprising amplitude and phase components to produce an output signal, the apparatus comprising an amplifier and a modulator, wherein the modulator modulates the phase component with a pulse width modulated (PWM) signal derived from the amplitude component and the amplifier receives the modulated phase component for amplification to produce the output signal, wherein the modulator comprises a switch configured to selectively supply the phase component to the amplifier.

2. The apparatus of claim 1, wherein the switching action of the switch is controlled by the PWM signal.

3. The apparatus of claim 1, further comprising a linearization scheme for counteracting distortion in the apparatus.

4. The apparatus of claim 3, wherein the linearization scheme is a predistortion scheme for predistorting the input signal.

5. The apparatus of claim 4, wherein the predistortion scheme comprises a predistorter for the amplitude component of the input signal.

6. The apparatus of claim 4, wherein the predistortion scheme comprises a predistorter for the phase component of the input signal.

7. The apparatus of claim 3, wherein a feedback signal from the amplifier output is used to provide adaptive control of the linearization scheme.

8. The apparatus of claim 1, wherein the input signal is provided in quadrature format and the apparatus comprises a converter configured to convert the quadrature signal into a polar signal.

9. The apparatus of claim 1, wherein the input signal is provided as a modulated carrier signal and the apparatus comprises a limiter configured to limit the input signal to produce the phase component.

10. The apparatus of claim 1, wherein the input signal is provided as a modulated carrier signal and the apparatus comprises a detector configured to detect the envelope of the input signal to derive the amplitude component.

11. The apparatus of claim 1, wherein the input signal is provided as a channel of amplitude modulation information and a channel of phase modulation information and the apparatus comprises a converter configured to derive the amplitude and phase components from the channels of amplitude and phase modulation information, respectively.

12. A method of amplifying an input signal to produce an output signal, comprising the steps of:
   (a) providing the input signal in polar form comprising an amplitude component and a phase component;
   (b) modulating the phase component with a pulse width modulated (PWM) signal derived from the amplitude component; and
   (c) amplifying the modulated phase component to produce the output signal, wherein the modulating comprises configuring a switch to selectively supply the phase component to be amplifier.

13. The method of claim 12, wherein the switching action of the switch is controlled by the PWM signal.

14. The apparatus of claim 8, wherein:
   the converter is adapted to generate a digital phase component of the polar signal; and
   the apparatus further comprises:
      a digital delay adapted to delay the digital phase component in a digital domain; and
      an analog delay adapted to delay, in an analog domain, an analog phase component generated from the delayed digital phase component.

15. An apparatus for amplifying an input signal provided in polar format comprising amplitude and phase components to produce an output signal, the apparatus comprising:
   an amplifier;
   a modulator, wherein the modulator modulates the phase component with a pulse width modulated (PWM) signal derived from the amplitude component and the amplifier receives the modulated phase component for amplification to produce the output signal; and
   a linearization scheme for counteracting distortion in the apparatus, wherein:
      the linearization scheme is a predistortion scheme for predistorting the input signal; and
      the predistortion scheme comprises a predistorter for the amplitude component of the input signal.

16. An apparatus for amplifying an input signal provided in polar format comprising amplitude and phase components to produce an output signal, the apparatus comprising:
   an amplifier;
   a modulator, wherein the modulator modulates the phase component with a pulse width modulated (PWM) signal derived from the amplitude component and the amplifier receives the modulated phase component for amplification to produce the output signal; and
   a linearization scheme for counteracting distortion in the apparatus, wherein a feedback signal from the amplifier output is used to provide adaptive control of the linearization scheme.

17. An apparatus for amplifying an input signal provided in polar format comprising amplitude and phase components to produce an output signal, the apparatus comprising:
   an amplifier;
   a modulator, wherein the modulator modulates the phase component with a pulse width modulated (PWM) signal derived from the amplitude component and the amplifier receives the modulated phase component for amplification to produce the output signal, wherein the input signal is provided in quadrature format; and
   a converter configured to convert the quadrature signal into a polar signal.

18. The apparatus of claim 17, wherein:
   the converter is adapted to generate a digital phase component of the polar signal; and
   the apparatus further comprises:
      a digital delay adapted to delay the digital phase component in a digital domain; and
      an analog delay adapted to delay, in an analog domain, an analog phase component generated from the delayed digital phase component.

19. An apparatus for amplifying an input signal provided in polar format comprising amplitude and phase components to produce an output signal, the apparatus comprising:
   an amplifier;
   a modulator, wherein the modulator modulates the phase component with a pulse width modulated (PWM) signal derived from the amplitude component and the amplifier receives the modulated phase component for amplification to produce the output signal, wherein the input signal is provided as a channel of amplitude modulation information and a channel of phase modulation information; and
   a converter configured to derive the amplitude and phase components from the channels of amplitude and phase modulation information, respectively.

* * * * *

UNITED STATES PATENT AND TRADEMARK OFFICE
CERTIFICATE OF CORRECTION

PATENT NO. : 6,794,931 B2
DATED : September 21, 2004
INVENTOR(S) : Peter Kenington It is certified that error appears in the above-identified patent and that said Letters Patent is hereby corrected as shown below:

Column 7,
Line 46, replace "to be amplifier" with -- to be amplified --.

Signed and Sealed this

Twenty-first Day of June, 2005

JON W. DUDAS
*Director of the United States Patent and Trademark Office*